United States Patent
Oyamada

(10) Patent No.: US 9,442,164 B2
(45) Date of Patent: Sep. 13, 2016

(54) APPARATUS FOR DETECTING FAILURE IN DRIVING CIRCUIT FOR ELECTRIC LIFTING-LOWERING DEVICE

(75) Inventor: Yasuhiko Oyamada, Nakakoma-gun (JP)

(73) Assignee: KITO CORPORATION, Yamanashi (JP)

( * ) Notice: Subject to any disclaimer, the term of this patent is extended or adjusted under 35 U.S.C. 154(b) by 333 days.

(21) Appl. No.: 13/822,802

(22) PCT Filed: Sep. 15, 2011

(86) PCT No.: PCT/JP2011/071148
§ 371 (c)(1),
(2), (4) Date: Mar. 13, 2013

(87) PCT Pub. No.: WO2012/043264
PCT Pub. Date: Apr. 5, 2012

(65) Prior Publication Data
US 2013/0176034 A1    Jul. 11, 2013

(30) Foreign Application Priority Data

Sep. 30, 2010 (JP) ................................ 2010-220187

(51) Int. Cl.
*G01R 31/327* (2006.01)
*H02J 3/44* (2006.01)
*H02P 29/024* (2016.01)

(52) U.S. Cl.
CPC ............... *G01R 31/327* (2013.01); *H02J 3/44* (2013.01); *H02P 29/0241* (2016.02)

(58) Field of Classification Search
CPC ....... G01R 31/327; H02J 3/44; H02P 29/021
USPC ........ 318/761, 758, 757, 741, 430, 434, 473
See application file for complete search history.

(56) References Cited

U.S. PATENT DOCUMENTS

| 4,333,119 | A | * | 6/1982 | Schoenmeyr | .......... H02H 7/097 |
| | | | | | 340/660 |
| 4,356,525 | A | * | 10/1982 | Kornrumpf | ............ H01H 9/542 |
| | | | | | 361/13 |

(Continued)

FOREIGN PATENT DOCUMENTS

| EP | 1160964 A2 * | 12/2001 | ............ H02M 3/335 |
| JP | 61-123638 U | 8/1986 | |

(Continued)

OTHER PUBLICATIONS

International Search Report of PCT/JP2011/071148, mailing date of Dec. 13, 2011.

*Primary Examiner* — Patrick Assouad
*Assistant Examiner* — Khristopher Yodichkas
(74) *Attorney, Agent, or Firm* — Westerman, Hattori, Daniels & Adrian, LLP

(57) ABSTRACT

Detecting circuits are connected in parallel to respective on/off mechanical contacts or on/off semiconductor devices of a motor contactor and/or a brake contactor of a driving circuit supplying driving electric power from a three-phase alternating-current power supply circuit to a three-phase alternating-current electric motor and a brake through the motor contactor and the brake contactor, respectively. The detecting circuits output pulse signals synchronized with the alternating current from the alternating-current power supply circuit. A signal processing circuit processes the pulse signals from the detecting circuits and detects a normal or abnormal condition of each on/off mechanical contact or on/off semiconductor device of the motor contactor and/or the brake contactor.

4 Claims, 7 Drawing Sheets

(56) References Cited

U.S. PATENT DOCUMENTS

| | | | | |
|---|---|---|---|---|
| 4,670,810 | A * | 6/1987 | Valeur | H03K 17/13 323/319 |
| 4,777,479 | A * | 10/1988 | Hinckley | H03K 17/18 200/308 |
| 4,801,828 | A * | 1/1989 | Ishikawa et al. | 327/462 |
| 4,996,469 | A * | 2/1991 | DeLange | H02P 1/28 318/757 |
| 5,343,134 | A * | 8/1994 | Wendt | G01L 5/284 318/362 |
| 5,528,443 | A * | 6/1996 | Itoga et al. | 361/8 |
| 6,147,616 | A * | 11/2000 | Kim | H02H 3/00 324/107 |
| 6,313,636 | B1 * | 11/2001 | Pohl | H01H 1/0015 324/421 |
| 6,347,024 | B1 * | 2/2002 | Blain et al. | 361/3 |
| 7,242,196 | B2 * | 7/2007 | Yudahira | B60L 3/0023 324/418 |
| 7,740,110 | B2 * | 6/2010 | Kattainen | B66B 1/32 187/288 |
| 2002/0093774 | A1 * | 7/2002 | Chung | 361/2 |
| 2005/0248308 | A1 * | 11/2005 | Reed | H02P 29/02 318/806 |
| 2009/0128972 | A1 * | 5/2009 | Wu | G01R 19/2513 361/77 |
| 2011/0121247 | A1 * | 5/2011 | Houser et al. | 254/292 |

FOREIGN PATENT DOCUMENTS

| | | |
|---|---|---|
| JP | 63-174729 U | 11/1988 |
| JP | 02-192316 A | 7/1990 |
| JP | 03-106838 U | 11/1991 |
| JP | 04-106099 A | 4/1992 |
| JP | 07-107658 A | 4/1995 |
| JP | 2006-038531 A | 2/2006 |
| JP | 2008-187819 A | 8/2008 |

* cited by examiner

APPARATUS FOR DETECTING FAILURE IN DRIVING CIRCUIT FOR ELECTRIC LIFTING-LOWERING DEVICE

TECHNICAL FIELD

The present invention relates to a failure detecting apparatus for detecting a failure in a driving circuit for supplying driving electric power to an electric motor and a brake of an electric lifting-lowering device, e.g. an electric chain block, or an electric hoist, i.e. detecting failures such as welding or fusing of a contactor or semiconductor device of the driving circuit, and reverse phase.

BACKGROUND ART

Conventional techniques of the type described above include those disclosed in Patent Literatures 1 to 5.

Patent Literature 1 discloses a technique relating to a phase switching device for a three-phase electric motor. The technique has three phase-detecting circuits detecting interphase signals at the zero-cross timing, and a control unit detecting an open phase by detecting whether or not there is a signal from the phase-detecting circuits. The control unit also judges the order in which the signals rise or fall to judge whether or not the three-phase alternating current is a positive-phase sequence current.

Patent Literature 2 discloses a technique relating to a circuit for detecting a reverse phase of a three-phase power supply. The technique has a signal generating circuit comprising a first photocoupler and a second photocoupler. The first photocoupler is activated by an R-S interphase voltage of a load input circuit connected to a three-phase power supply having an R phase, an S phase, and a T phase. The second photocoupler is activated by an R-T interphase voltage of the load input circuit. When an output signal from either one of the two photocouplers rises or falls, a judgment is made as to whether or not there is an output signal from the other photocoupler, thereby detecting an improper connection in the three-phase power supply.

Patent Literature 3 discloses a technique relating to an apparatus for detecting a frequency, open phase and reverse phase of an alternating-current power supply. The technique has a photocoupler activated by the alternating-current power supply, and a pulse duration detecting means detecting a pulse duration from the rise to the fall of an output signal from the photocoupler. When the pulse duration detected by the pulse duration detecting means is not within an allowable value, it is judged that the alternating-current power supply has noise imposed thereon.

Patent Literature 4 discloses a technique relating to an apparatus for detecting a reverse phase of a three-phase alternating-current power supply. The technique is provided with a voltage input means digitizing and inputting an alternating-current voltage signal of each phase after lowering the signal to a predetermined level, a phase signal generating means generating a power supply phase signal indicating a phase shift of each phase relative to a predetermined phase on the basis of the alternating-current voltage signal of each phase input by the voltage input means, a lead direction detecting means detecting a lead direction of the power supply phase signal generated by the phase signal generating means, and a reverse phase judging means judging a reverse-phase condition of the three-phase alternating-current power supply on the basis of the lead direction of the power supply phase signal detected by the lead direction detecting means.

Patent Literature 5 discloses a technique relating to an apparatus for detecting an abnormality in a driving circuit. The technique has an abnormality detecting circuit connected in parallel to a semiconductor device and formed to generate a pulse signal synchronized with an alternating-current power supply when the semiconductor device is in the state of cutting off a load current, a discriminating signal detecting circuit discriminating between an electric current flowing through the abnormality detecting circuit for the semiconductor device and the load current, and a judging circuit judging the content of abnormality from output signals from the abnormality detecting circuit and the discriminating signal detecting circuit.

CITATION LIST

Patent Literature

[PTL 1] Japanese Patent Application Publication No. 2008-187819
[PTL 2] Japanese Utility Model Registration Application Publication No. Hei 3-106838
[PTL 3] Japanese Patent Application Publication No. Hei 7-107658
[PTL 4] Japanese Patent Application Publication No. 2006-38531
[PTL 5] Japanese Patent Application Publication No. Hei 2-192316

SUMMARY OF INVENTION

Technical Problem

The techniques disclosed in the above-cited Literatures 1 to 4 are configured to detect interphase voltages of an alternating-current power supply and do not have the function to directly monitor a contactor or semiconductor device itself of a driving circuit. Therefore, the above-described techniques have the problem that it is impossible to monitor the state of the contactor or the semiconductor device (e.g. welding or fusing of a contact of the contactor).

The technique disclosed in the above-cited Literature 5 is a driving circuit for a solenoid valve and does not use a three-phase alternating-current power supply. Therefore, the technique does not have a reverse-phase detecting function to detect a reverse phase of a three-phase alternating current.

The present invention has been made in view of the above-described circumstances. An object of the present invention is to provide a failure detecting apparatus for detecting a failure in a driving circuit for supplying driving electric power from a three-phase alternating-current power supply circuit to a three-phase alternating-current electric motor and a brake of an electric lifting-lowering device, e.g. an electric chain block, or an electric hoist, through a motor contactor and a brake contactor, respectively, the failure detecting apparatus being capable of monitoring the state of each on/off mechanical contact or on/off semiconductor device of each contactor of the driving circuit, and having a reverse-phase detecting function and a welding detecting function to detect a reverse phase of the three-phase alternating current and to detect welding, respectively, before the on/off mechanical contact or on/off semiconductor device of each contactor is turned on, and further having a fusing detecting function to detect fusing after the on/off mechanical contact or on/off semiconductor device of each contactor has been turned on.

Solution to Problem

To solve the above-described problem, the present invention provides a failure detecting apparatus for detecting a failure in a driving circuit for an electric lifting-lowering device, the driving circuit having an alternating-current power supply circuit and supplying driving electric power from the alternating-current power supply circuit to an alternating-current electric motor and a brake through a motor contactor and a brake contactor, respectively. The failure detecting apparatus is provided with a detecting circuit connected in parallel to each on/off mechanical contact or on/off semiconductor device of the motor contactor and/or the brake contactor and outputting a pulse signal synchronized with an alternating current from the alternating-current power supply circuit, and a signal processing means having a normal-abnormal detecting function, the signal processing means processing the pulse signal from the detecting circuit and detecting a normal or abnormal condition of each on/off mechanical contact or on/off semiconductor device of the motor contactor and/or the brake contactor.

Further, in the above-described failure detecting apparatus of the present invention, the alternating-current power supply circuit is a three-phase alternating-current power supply circuit. The alternating-current electric motor is a three-phase alternating-current electric motor. The motor contactor is a three-phase contactor. The signal processing means processes the pulse signal from the detecting circuit connected in parallel to each on/off mechanical contact or on/off semiconductor device of the motor contactor, which is a three-phase contactor, and detects a reverse phase of the three-phase electric power to be supplied to the three-phase alternating current electric motor by the normal-abnormal detecting function.

Further, in the above-described failure detecting apparatus of the present invention, the detecting circuit has a photocoupler comprising a light-emitting diode and a phototransistor, in which the light-emitting diode is caused to emit light by an alternating-current voltage applied to the on/off mechanical contact or the on/off semiconductor device, and the light is converted into an electric pulse signal by the phototransistor.

Advantageous Effects of Invention

According to the present invention, the failure detecting apparatus is provided with a detecting circuit connected in parallel to each on/off mechanical contact or on/off semiconductor device of the motor contactor and/or the brake contactor and outputting a pulse signal synchronized with an alternating current from the alternating-current power supply circuit, and a signal processing means having a normal-abnormal detecting function, the signal processing means processing the pulse signal from the detecting circuit and detecting a normal or abnormal condition of each on/off mechanical contact or on/off semiconductor device of the motor contactor and/or the brake contactor. Therefore, it is possible to detect, in a fail-safe manner, whether each on/off mechanical contact or on/off semiconductor device of the motor contactor and/or the brake contactor is normal or abnormal (welded or fused) before or after the on/off mechanical contact or on/off semiconductor device of the motor contactor and/or the brake contactor turns on.

Further, according to the present invention, the signal processing means processes the pulse signal from the detecting circuit connected in parallel to each on/off mechanical contact or on/off semiconductor device of the motor contactor, which is a three-phase contactor, and detects a reverse phase of the three-phase electric power to be supplied to the three-phase alternating current electric motor by the normal-abnormal detecting function. Therefore, if the three-phase electric power to be supplied to the three-phase alternating-current electric motor is reverse-phase power before the on/off mechanical contact or on/off semiconductor device of the motor contactor turns on, the reverse phase can be detected before the driving electric power is supplied to the three-phase alternating-current electric motor.

DESCRIPTION OF EMBODIMENTS

Example 1

Figure 1A:
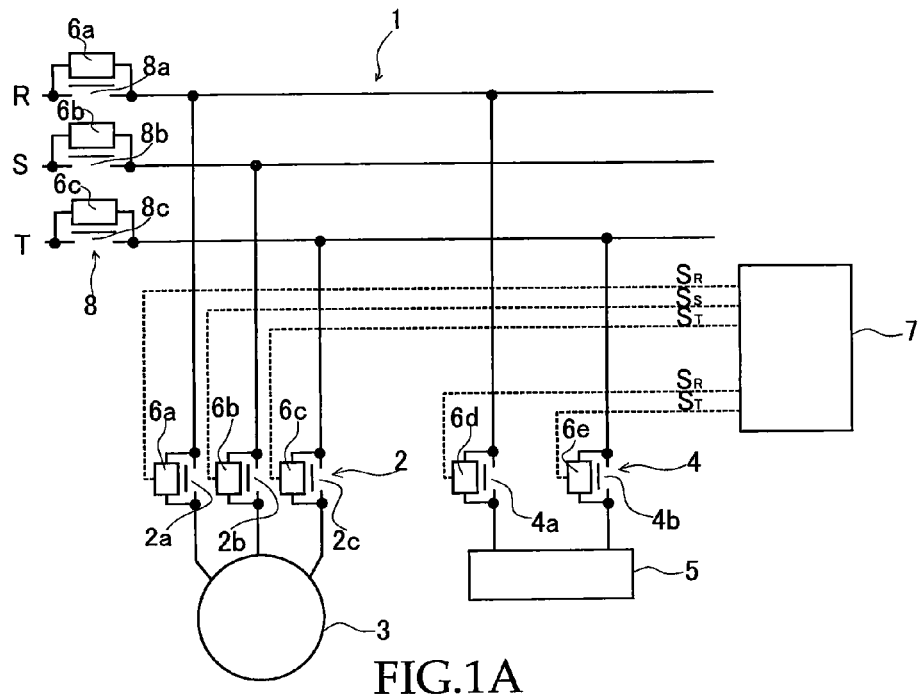
FIG. 1 is a diagram showing the circuit configuration of a failure detecting apparatus for detecting a failure in a driving circuit for an electric lifting-lowering device according to the present invention.
Figure 1B:
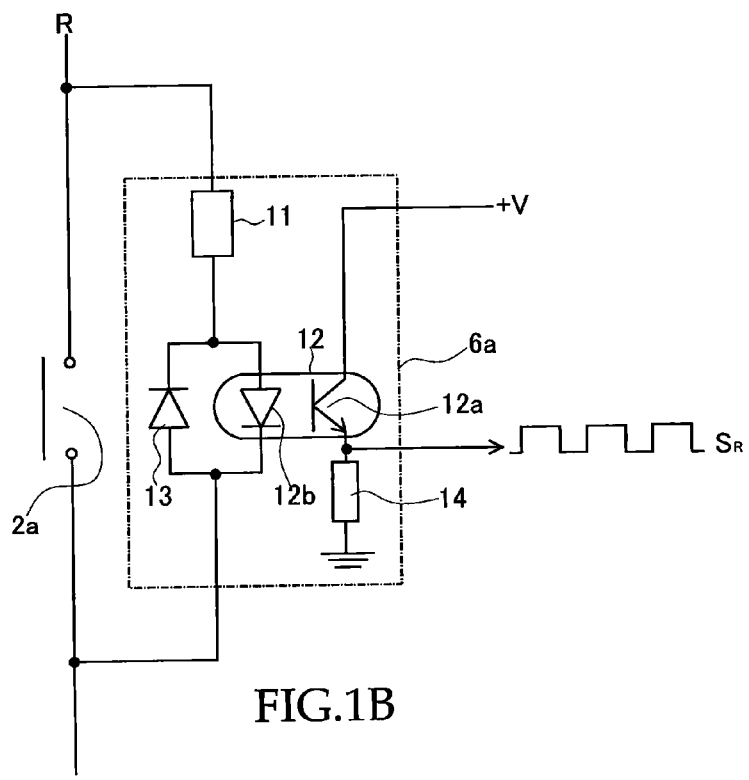

An embodiment of the present invention will be explained below in detail. FIG. 1 is a diagram showing the circuit configuration of a failure detecting apparatus for an electric lifting-lowering device according to the present invention. Part (a) of FIG. 1 is a diagram showing the overall configuration. Part (b) of FIG. 1 is a diagram showing a configuration example of a detecting circuit. In FIG. 1, reference numeral 1 denotes a three-phase alternating-current power supply circuit having an R phase, an S phase, and a T phase. Driving electric power is supplied from the three-phase alternating-current power supply circuit 1 to a three-phase alternating-current electric motor 3 for lifting and lowering through a motor contactor 2. In addition, driving electric power is supplied from the three-phase alternating-current power supply circuit 1 to a brake 5 through a brake contactor 4.

On/off mechanical contacts 2a, 2b and 2c of the motor contactor 2 are connected in parallel to detecting circuits 6a, 6b and 6c, respectively, which output electric pulse signals $S_R$, $S_S$ and $S_T$ synchronized with the R-, S- and T-phase alternating-current voltages of the alternating-current power supply circuit 1. The electric pulse signals $S_R$, $S_S$ and $S_T$ from the detecting circuits 6a, 6b and 6c are input to a signal processing circuit 7. On/off mechanical contacts 4a and 4b of the brake contactor 4 are connected in parallel to detecting circuits 6d and 6e, respectively, which output electric pulse signals $S_R$ and $S_T$ synchronized with the R- and T-phase alternating-current voltages of the three-phase alternating-current power supply circuit 1. The electric pulse signals $S_R$ and $S_T$ from the detecting circuits 6d and 6e are input to the signal processing circuit 7.

Part (b) of FIG. 1 is a diagram showing a configuration example of the detecting circuit 6a connected in parallel to the on/off mechanical contact 2a of the motor contactor 2. As shown in the figure, in the detecting circuit 6a, a series circuit of a resistor 11 and a photodiode 12b of a photocoupler 12 is connected in parallel to the on/off mechanical contact 2a of the motor contactor 2, and a reverse protection diode 13 is connected in parallel to the photodiode 12b. Further, a resistor 14 is connected to the emitter of a phototransistor 12a of the photocoupler 12, and a direct-current power supply of +V is connected to the collector of the phototransistor 12a. When the on/off mechanical contact 2a of the motor contactor 2 is open (off), the R-phase voltage of the three-phase alternating-current power supply circuit 1 is applied to the photodiode 12b through the resistor 11, causing the photodiode 12b to emit light. Upon receiving the light emitted from the photodiode 12b, the phototransistor 12a turns on, and an electric pulse signal $S_R$ is output to the signal processing circuit 7. The present invention is not limited to this embodiment. Instead of using the reverse protection diode, a full-wave rectification type photocoupler may be used. The pulse signal can be formed by adjusting the threshold voltage of the phototransistor 12a through the resistor 11.

It should be noted that the detecting circuits 6b, 6c, 6d and 6e each have the same structure as that of the detecting circuit 6a; therefore, a description thereof is omitted. Reference numeral 8 denotes an emergency stop contactor, through which three-phase electric power is supplied to the three-phase alternating-current power supply circuit 1 from a commercial three-phase alternating-current power supply. It should be noted that detecting circuits 6a, 6b and 6c are also connected in parallel to on/off mechanical contacts 8a, 8b and 8c, respectively, of the emergency stop contactor 8 to monitor the state of each on/off mechanical contact. In FIG. 1, the motor contactor 2, the brake contactor 4, and the emergency stop contactor 8 are contactors each having on/off mechanical contacts. The motor contactor 2, the brake contactor 4, and the emergency stop contactor 8 may be contactors each having on/off semiconductor devices in place of the on/off mechanical contacts. Further, although the above-described electric lifting-lowering device has the three-phase alternating-current electric motor 3 for lifting and lowering, by way of example, the electric lifting-lowering device may further have three-phase alternating-current electric motors 3 for traversing and traveling.

In the failure detecting apparatus having the above-described circuit configuration, if the R-, S- and T-phase alternating-current voltages of the three-phase alternating-current power supply circuit 1 are applied to the on/off mechanical contacts 2a, 2b and 2c, respectively, of the motor contactor 2 when the on/off mechanical contacts are off, electric pulse signals $S_R$, $S_S$ and $S_T$ synchronized with the R-, S- and T-phase alternating-current voltages are input to the signal processing circuit 7 unless the on/off mechanical contacts 2a, 2b and 2c are welded (i.e. unless the contacts are conducting because of being welded). The signal processing circuit 7 has a reverse-phase detecting function, as detailed later. Therefore, if the electric power input to the motor contactor 2 from the three-phase alternating-current power supply circuit 1 is reverse-phase power, the signal processing circuit 7 can detect the reverse phase of the three-phase electric power before turning on the motor contactor 2 to supply the reverse-phase power to the three-phase alternating-current electric motor 3.

If any of the on/off mechanical contacts 2a, 2b and 2c of the motor contactor 2 and the on/off mechanical contacts 4a and 4b of the brake contactor 4 is conducting because of being welded, for example, despite the fact that the contactor concerned is off, even if the alternating-current voltage of the corresponding phase is applied to the on/off mechanical contact, no voltage appears across the on/off mechanical contact. Consequently, the photocoupler 12 is not activated, and no electric pulse signal is output from the phototransistor 12a. Accordingly, it is possible to detect the welding of the on/off mechanical contact. If any of the on/off mechanical contacts 2a, 2b and 2c and the on/off mechanical contacts 4a and 4b is fused, even if the motor contactor 2 and the brake contactor 4 are turned on, the fused contact remains off. Consequently, an electric pulse signal is output from the detecting circuit 6, and the open phase can be detected from this. The processing procedure for detecting a reverse phase and an open phase, which is carried out by the signal processing circuit 7, will be explained below in detail.

Figures 2A, 2B, 2C, 2D, 2E:
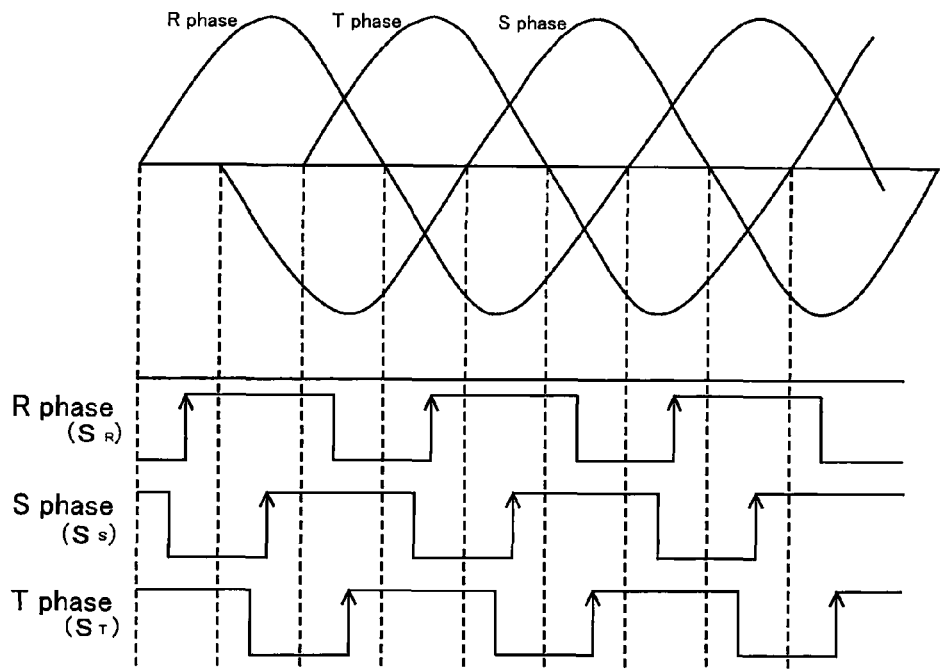
FIG. 2 is a diagram showing three-phase alternating-current voltages and electric pulse signals $S_R$, $S_S$ and $S_T$ from respective detecting circuits.

FIG. 2 is a diagram showing the R-, S- and T-phase alternating-current voltages applied to the on/off mechanical contacts 2a, 2b and 2c of the motor contactor 2, the electric pulse signals $S_R$, $S_S$ and $S_T$ output from the detecting circuits 6a, 6b and 6c, the high (H) and low (L) levels of the electric pulse signals $S_R$, $S_S$ and $S_T$ when the phase sequence is normal (part (b) of FIG. 2), the high (H) and low (L) levels of the electric pulse signals $S_R$, $S_S$ and $S_T$ when the phase sequence is reverse-phase sequence (part (c) of FIG. 2), the high (H) and low (L) levels of the electric pulse signals $S_R$, $S_S$ and $S_T$ when any of the contacts is welded (part (d) of FIG. 2), and the high (H) and low (L) levels of the electric pulse signals $S_R$, $S_S$ and $S_T$ when any of the contacts is fused (part (e) of FIG. 2). As shown in part (a) of FIG. 2, if the three-phase alternating current is applied from the three-phase alternating-current power supply circuit 1 when the motor contactor 2 is off, electric pulse signals $S_R$, $S_S$ and $S_T$ synchronized with the R-, S- and T-phase alternating-current voltages are output from the detecting circuits 6a, 6b and 6c to the signal processing circuit 7.

The signal processing circuit 7 comprises a microcomputer. In FIG. 2, every time the alternating-current voltage of each of the R-, S- and T-phases is input, the signal processing circuit 7 reads the high (H) and low (L) levels of the electric pulse signals $S_R$, $S_S$ and $S_T$ from the input ports. When the three-phase alternating-current voltages having the normal-phase sequence are applied to the on/off mechanical contacts 2a, 2b and 2c of the motor contactor 2, the high (H) and low (L) levels of the electric pulse signals $S_R$, $S_S$ and $S_T$ are as shown in part (b) of FIG. 2. If the high (H) and low (L) levels of the electric pulse signals $S_R$, $S_S$ and $S_T$ from the detecting circuits 6a, 6b and 6c are as shown in part (b) of FIG. 2 when the motor contactor 2 is off, the signal processing circuit 7 can detect from this that the phase sequence is normal before turning on the motor contactor 2 to supply the driving electric power to the three-phase alternating-current electric motor 3.

If the order of the S and T phases is reversed, i.e. the three phases are in the order R phase, T phase and S phase, for example, the high (H) and low (L) levels of the electric pulse signals $S_R$, $S_S$ and $S_T$ are as shown in part (c) of FIG. 2. If the high (H) and low (L) levels of the electric pulse signals $S_R$, $S_S$ and $S_T$ from the detecting circuits 6a, 6b and 6c are as shown in part (c) of FIG. 2 when the motor contactor 2 is off, the signal processing circuit 7 can detect from this that the order of the S and T phases is reversed (reverse-phase sequence) before turning on the motor contactor 2 to supply the reverse-phase driving electric power to the three-phase alternating-current electric motor 3. That is, the reverse-phase driving electric power can be detected before being supplied to the three-phase alternating-current electric motor 3.

If the S-phase on/off mechanical contact 2b of the motor contactor 2 is welded, for example, even if the three-phase alternating current is applied from the three-phase alternating-current power supply circuit 1 when the motor contactor 2 is off, the photocoupler 12 is inoperative because the on/off mechanical contact 2b is conducting. Therefore, the electric pulse signal $S_S$ from the detecting circuit 6b is at the low (L) level. Consequently, the high (H) and low (L) levels of the electric pulse signals $S_R$, $S_S$ and $S_T$ are as shown in part (d) of FIG. 2. If the high (H) and low (L) levels of the electric pulse signals $S_R$, $S_S$ and $S_T$ are as shown in part (d) of FIG. 2 when the motor contactor 2 is off, the signal processing circuit 7 can detect from this that the on/off mechanical contact 2b of the motor contactor 2 is welded (welding phase sequence) before turning on the motor contactor 2.

If the S-phase on/off mechanical contact 2b of the motor contactor 2 is fused, for example, when the motor contactor 2 is turned on to apply the three-phase alternating current from the three-phase alternating-current power supply circuit 1, an electric pulse signal $S_S$ synchronized with the S-phase alternating-current voltage is output from the detecting circuit 6b to the signal processing circuit 7 because the on/off mechanical contact 2b is off. Consequently, the high (H) and low (L) levels of the electric pulse signals $S_R$, $S_S$ and $S_T$ are as shown in part (e) of FIG. 2. If the high (H) and low (L) levels of the electric pulse signals $S_R$, $S_S$ and $S_T$ are as shown in part (e) of FIG. 2 when the motor contactor 2 is on, the signal processing circuit 7 can detect from this that the on/off mechanical contact 2b of the motor contactor 2 is fused (open-phase sequence) by turning on the motor contactor 2.

Figure 3:
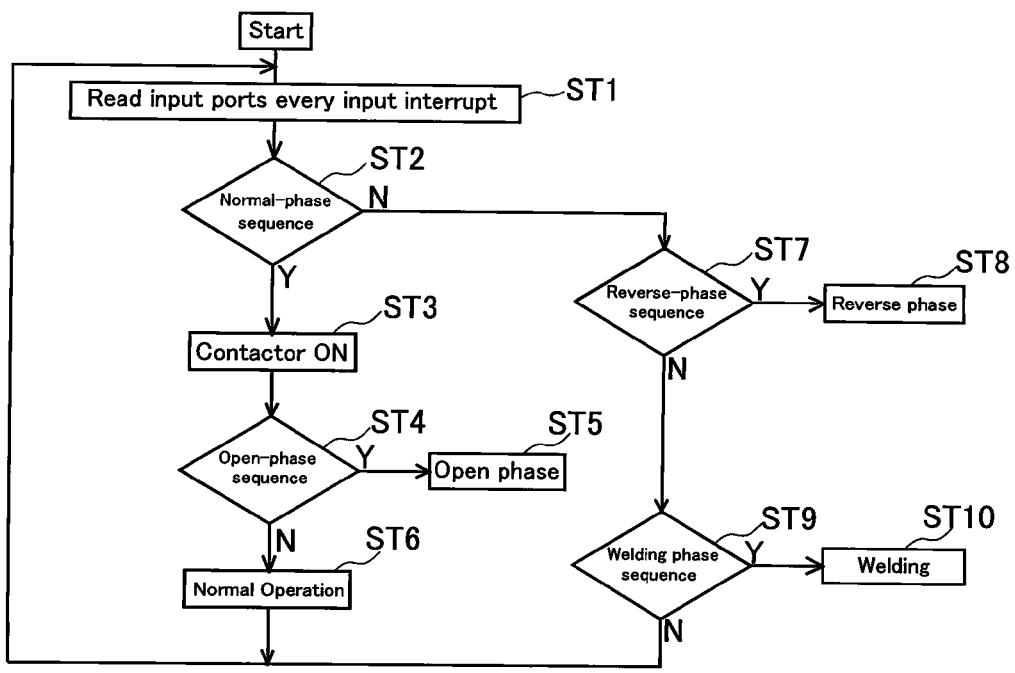
FIG. 3 is a chart showing a processing flow for detecting a reverse phase and an open phase by the failure detecting apparatus according to the present invention.

FIG. 3 is a flow chart showing the process for detecting a normal-phase sequence, open-phase sequence, reverse-phase sequence and welding phase sequence carried out by the signal processing circuit 7, which comprises a microcomputer. First, at step ST1, the motor contactor 2 is turned off, and the input ports are read every time an input interrupt occurs. Next, at step ST2, the high (H) and low (L) levels of the electric pulse signals $S_R$, $S_S$ and $S_T$ are detected to judge whether or not the phase sequence of the three-phase alternating current in the motor contactor 2 is normal. If the phase sequence is normal (Yes), the motor contactor 2 is turned on at step ST3. Subsequently, it is judged at step ST4 whether or not the phase sequence is open-phase sequence. If the phase sequence is open-phase sequence (Yes), it is informed at step ST5 that an open phase has been detected. If it is judged that the phase sequence is not open-phase sequence (No), the three-phase alternating-current electric motor 3 is operated normally at step ST6.

If it is judged at the above-described step ST2 that the phase sequence is not normal (No), the process shifts to step ST7, at which it is judged whether or not the phase sequence is reverse-phase sequence. If the phase sequence is reverse-phase sequence (Yes), it is informed at step ST8 that a reverse phase has been detected. If it is judged that the phase sequence is not reverse-phase sequence (No), the process shifts to step ST9, at which it is judged whether or not the phase sequence is welding phase sequence. If the phase sequence is welding phase sequence (Yes), it is informed at step ST10 that welding has been detected. If the phase sequence is not welding phase sequence (No), the process returns to step ST1 to repeat the processing.

Example 2

Figures 4A, 4B, 4C, 4D, 4E:
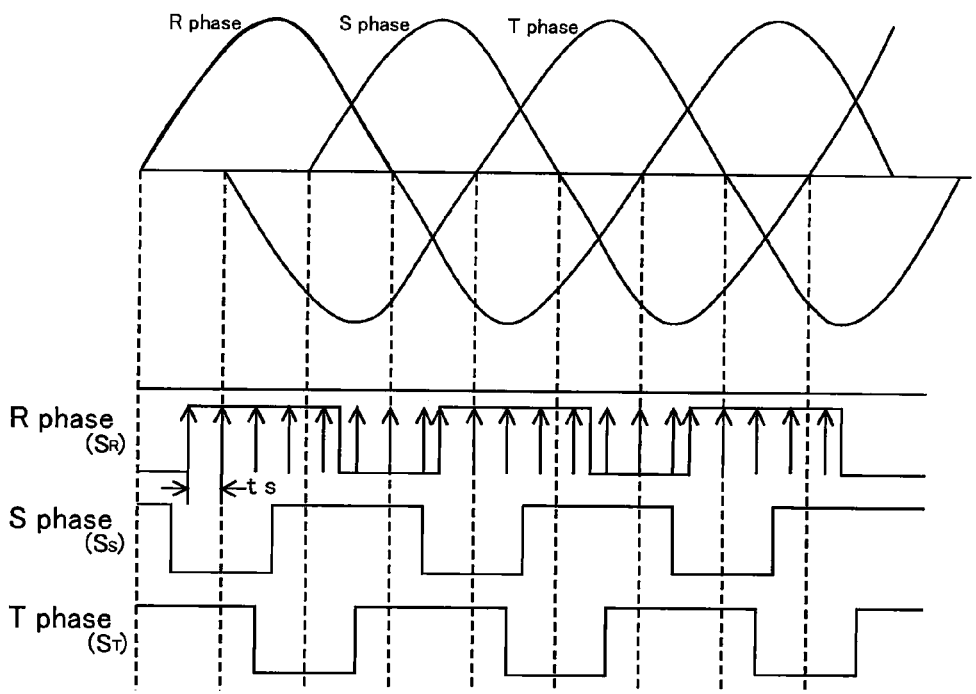
FIG. 4 is a diagram showing three-phase alternating-current voltages and electric pulse signals $S_R$, $S_S$ and $S_T$ from respective detecting circuits.

In FIG. 2, the signal processing circuit 7 reads the electric pulse signals $S_R$, $S_S$ and $S_T$ from the input ports every time the alternating-current voltage of each of the R-, S- and T-phases is input. In FIG. 4, the signal processing circuit 7 reads the high (H) and low (L) levels of the electric pulse signals $S_R$, $S_S$ and $S_T$ from the input ports every predetermined period of time (t seconds in the figure) by performing a timer interrupt. When three-phase alternating current voltages with a normal-phase sequence are applied to the on/off mechanical contacts 2a, 2b and 2c of the motor contactor 2, the high (H) and low (L) levels of the electric pulse signals $S_R$, $S_S$ and $S_T$ are as shown in part (b) of FIG. 4. If the high (H) and low (L) levels of the electric pulse signals $S_R$, $S_S$ and $S_T$ from the detecting circuits 6a, 6b and 6c are as shown in part (b) of FIG. 4 when the motor contactor 2 is off, the signal processing circuit 7 can detect from this that the phase sequence is normal before turning on the motor contactor 2 to supply the driving electric power to the three-phase alternating-current electric motor 3.

If the order of the S and T phases is reversed, i.e. the three phases are in the order R phase, T phase and S phase, for example, the high (H) and low (L) levels of the electric pulse signals $S_R$, $S_S$ and $S_T$ are as shown in part (c) of FIG. 4. If the high (H) and low (L) levels of the electric pulse signals $S_R$, $S_S$ and $S_T$ from the detecting circuits 6a, 6b and 6c are as shown in part (c) of FIG. 4 when the motor contactor 2 is off, the signal processing circuit 7 can detect from this that the order of the S and T phases is reversed before turning on the motor contactor 2 to supply the reverse-phase driving electric power to the three-phase alternating-current electric motor 3.

If the S-phase on/off mechanical contact 2b of the motor contactor 2 is welded, for example, even if the three-phase alternating current is applied from the three-phase alternating-current power supply circuit 1 when the motor contactor 2 is off, the photocoupler 12 is inoperative because the on/off mechanical contact 2b is conducting. Therefore, the electric pulse signal $S_S$ from the detecting circuit 6b is at the low (L) level. Consequently, the high (H) and low (L) levels of the electric pulse signals $S_R$, $S_S$ and $S_T$ are as shown in part (d) of FIG. 4. If the high (H) and low (L) levels of the electric pulse signals $S_R$, $S_S$ and $S_T$ are as shown in part (d) of FIG. 4 when the motor contactor 2 is off, the signal processing circuit 7 can detect from this that the on/off mechanical contact 2b of the motor contactor 2 is welded before turning on the motor contactor 2.

If the S-phase on/off mechanical contact 2b of the motor contactor 2 is fused, for example, when the motor contactor 2 is turned on to apply the three-phase alternating current from the three-phase alternating-current power supply circuit 1, an electric pulse signal $S_S$ synchronized with the S-phase alternating-current voltage is output from the detecting circuit 6b to the signal processing circuit 7 because the on/off mechanical contact 2b is off. Consequently, the high (H) and low (L) levels of the electric pulse signals $S_R$, $S_S$ and $S_T$ are as shown in part (e) of FIG. 4. If the high (H) and low (L) levels of the electric pulse signals $S_R$, $S_S$ and $S_T$ are as shown in part (e) of FIG. 4 when the motor contactor 2 is on, the signal processing circuit 7 can detect from this that the on/off mechanical contact 2b of the motor contactor 2 is fused (open-phase condition) by turning on the motor contactor 2.

Figure 5:
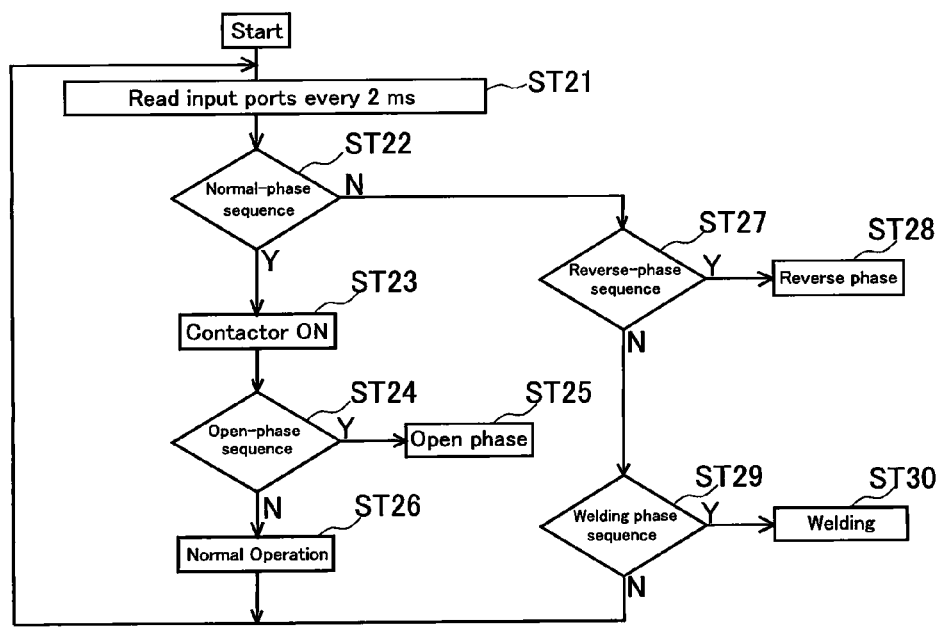
FIG. 5 is a chart showing a processing flow for detecting a reverse phase and an open phase by the failure detecting apparatus according to the present invention.

FIG. 5 is a flow chart showing the process for detecting a normal-phase sequence, open-phase sequence, reverse-phase sequence and welding phase sequence carried out by the signal processing circuit 7, which comprises a microcomputer. First, at step ST21, the motor contactor 2 is turned off, and the input ports are read every predetermined period of time (every 2 ms in the figure). Next, at step ST22, the high (H) and low (L) levels of the electric pulse signals $S_R$, $S_S$ and $S_T$ are detected to judge whether or not the phase sequence of the three-phase alternating current in the motor contactor 2 is normal. If the phase sequence is normal (Yes), the motor contactor 2 is turned on at step ST23. Subsequently, it is judged at step ST24 whether or not the phase sequence is open-phase sequence. If the phase sequence is open-phase sequence (Yes), it is informed at step ST25 that an open phase has been detected. If the phase sequence is not open-phase sequence (No), the three-phase alternating-current electric motor 3 is operated normally at step ST26.

If it is judged at the above-described step ST22 that the phase sequence is not normal (No), the process shifts to step ST27, at which it is judged whether or not the phase sequence is reverse-phase sequence. If the phase sequence is reverse-phase sequence (Yes), it is informed at step ST28 that a reverse phase has been detected. If it is judged that the phase sequence is not reverse-phase sequence (No), the process shifts to step ST29, and if the phase sequence is welding phase sequence (Yes), it is informed at step ST30 that welding has been detected. If the phase sequence is not welding phase sequence (No), the process returns to step ST21 to repeat the processing.

Example 3

Figures 6A, 6B, 6C, 6D, 6E:
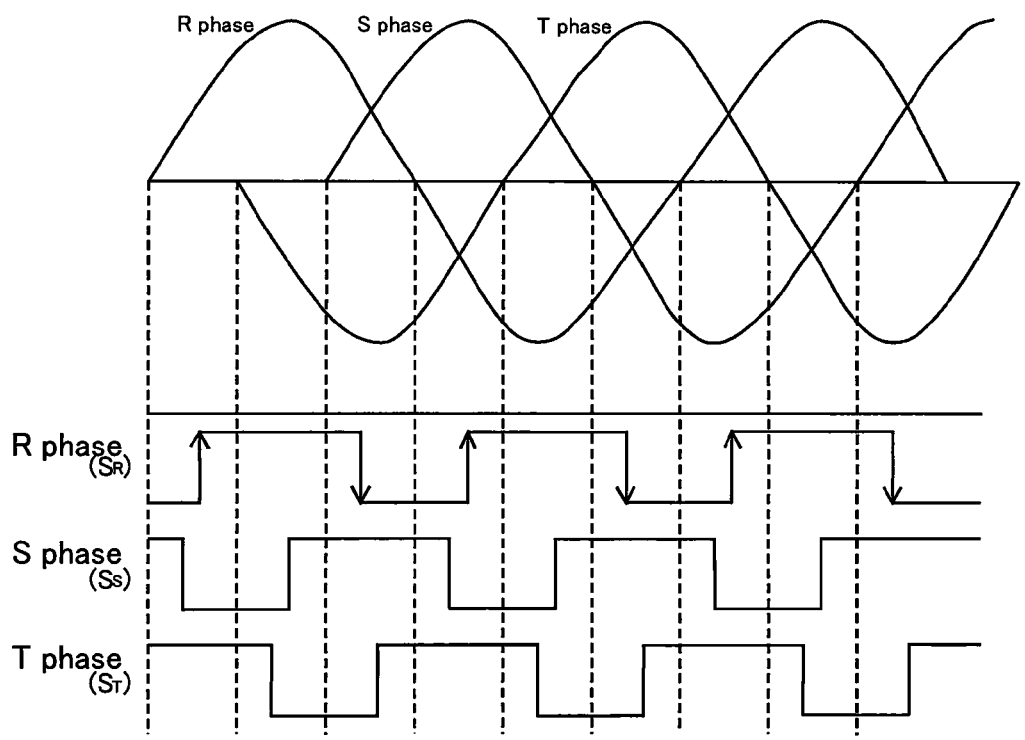
FIG. 6 is a diagram showing three-phase alternating-current voltages and electric pulse signals $S_R$, $S_S$ and $S_T$ from respective detecting circuits.

FIG. 6 is a diagram showing the way in which the signal processing circuit 7 reads the high (H) and low (L) levels of the electric pulse signals $S_R$, $S_S$ and $S_T$ from the input ports by performing an interrupt based on an alternating-current voltage of one phase (R-phase alternating-current voltage in the figure). When three-phase alternating current voltages with a normal-phase sequence are applied to the on/off mechanical contacts 2a, 2b and 2c of the motor contactor 2, the high (H) and low (L) levels of the electric pulse signals $S_R$, $S_S$ and $S_T$ are as shown in part (b) of FIG. 6. If the high (H) and low (L) levels of the electric pulse signals $S_R$, $S_S$ and $S_T$ from the detecting circuits 6a, 6b and 6c are as shown in part (b) of FIG. 6 when the motor contactor 2 is off, the signal processing circuit 7 can detect from this that the phase sequence is normal before turning on the motor contactor 2 to supply the driving electric power to the three-phase alternating-current electric motor 3.

If the order of the S and T phases is reversed, i.e. the three phases are in the order R phase, T phase and S phase, for example, the high (H) and low (L) levels of the electric pulse signals $S_R$, $S_S$ and $S_T$ are as shown in part (c) of FIG. 6. If the high (H) and low (L) levels of the electric pulse signals $S_R$, $S_S$ and $S_T$ from the detecting circuits 6a, 6b and 6c are as shown in part (c) of FIG. 6 when the motor contactor 2 is off, the signal processing circuit 7 can detect from this that the order of the S and T phases is reversed before turning on the motor contactor 2 to supply the reverse-phase driving electric power to the three-phase alternating-current electric motor 3.

If the S-phase on/off mechanical contact 2b of the motor contactor 2 is welded, for example, even if the three-phase alternating current is applied from the three-phase alternating-current power supply circuit 1 when the motor contactor 2 is off, the photocoupler 12 is inoperative because the on/off mechanical contact 2b is conducting. Therefore, the electric pulse signal $S_S$ from the detecting circuit 6b is at the low (L) level. Consequently, the high (H) and low (L) levels of the electric pulse signals $S_R$, $S_S$ and $S_T$ are as shown in part (d) of FIG. 6. If the high (H) and low (L) levels of the electric pulse signals $S_R$, $S_S$ and $S_T$ are as shown in part (d) of FIG. 6 when the motor contactor 2 is off, the signal processing circuit 7 can detect from this that the on/off mechanical contact 2b of the motor contactor 2 is welded before turning on the motor contactor 2.

If the S-phase on/off mechanical contact 2b of the motor contactor 2 is fused, for example, when the motor contactor 2 is turned on to apply the three-phase alternating current from the three-phase alternating-current power supply circuit 1, an electric pulse signal $S_S$ synchronized with the S-phase alternating-current voltage is output from the detecting circuit 6b to the signal processing circuit 7 because the on/off mechanical contact 2b is off. Consequently, the high (H) and low (L) levels of the electric pulse signals $S_R$, $S_S$ and $S_T$ are as shown in part (e) of FIG. 6. If the high (H) and low (L) levels of the electric pulse signals $S_R$, $S_S$ and $S_T$ are as shown in part (e) of FIG. 6 when the motor contactor 2 is on, the signal processing circuit 7 can detect from this that the on/off mechanical contact 2b of the motor contactor 2 is fused (open-phase condition) by turning on the motor contactor 2.

Figure 7:
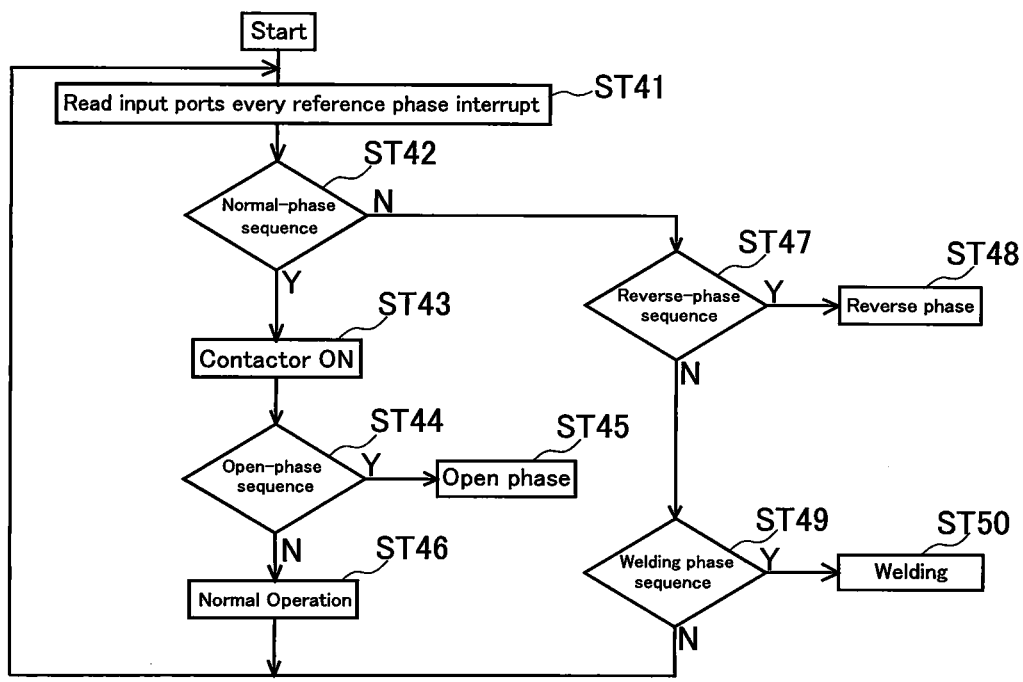
FIG. 7 is a chart showing a processing flow for detecting a reverse phase and an open phase by the failure detecting apparatus according to the present invention.

FIG. 7 is a flow chart showing the process for detecting a normal-phase sequence, open-phase sequence, reverse-phase sequence and welding phase sequence carried out by the signal processing circuit 7, which comprises a microcomputer. First, at step ST41, the motor contactor 2 is turned off, and the input ports are read every time an interrupt based on a reference phase (R phase in the figure) occurs. Next, at step ST42, the high (H) and low (L) levels of the electric pulse signals $S_R$, $S_S$ and $S_T$ are detected to judge whether or not the phase sequence of the three-phase alternating current in the motor contactor 2 is normal. If the phase sequence is normal (Yes), the motor contactor 2 is turned on at step ST43. Subsequently, it is judged at step ST44 whether or not the phase sequence is open-phase sequence. If the phase sequence is open phase sequence (Yes), it is informed at step ST45 that an open phase has been detected. If the phase sequence is not open phase sequence (No), the three-phase alternating-current electric motor 3 is operated normally at step ST46.

If it is judged at the above-described step ST42 that the phase sequence is not normal (No), the process shifts to step ST47, at which it is judged whether or not the phase sequence is reverse-phase sequence. If the phase sequence is reverse-phase sequence (Yes), it is informed at step ST48 that a reverse phase has been detected. If it is judged that the phase sequence is not reverse-phase sequence (No), the process shifts to step ST49, at which it is judged whether or not the phase sequence is welding phase sequence. If the phase sequence is welding phase sequence (Yes), it is informed at step ST50 that welding has been detected. If it is judged that the phase sequence is not welding phase sequence (No), the process returns to step ST41 to repeat the processing.

Although some embodiments of the present invention have been explained above, the present invention is not limited to the above-described embodiments but can be modified in a variety of ways without departing from the scope of the claims and the technical idea indicated in the specification and the drawings. In the foregoing embodiments, the present invention has been explained with regard to a driving circuit for an electric lifting-lowering device, by way of example, which has on/off mechanical contacts to constitute the motor contactor 2 and the brake contactor 4 of the driving circuit. The present invention, however, is not limited to the above-described driving circuit but may also be applied to a driving circuit for an electric lifting-lowering device that has a motor contactor 2 and a brake contactor 4 each having on/off semiconductor devices.

INDUSTRIAL APPLICABILITY

The present invention is provided with a detecting circuit connected in parallel to each on/off mechanical contact or on/off semiconductor device of a motor contactor and/or a brake contactor and outputting a pulse signal synchronized with an alternating current from an alternating-current power supply circuit, and a signal processing means having a normal-abnormal detecting function, the signal processing means processing the pulse signal from the detecting circuit and detecting a normal or abnormal condition of each on/off mechanical contact or on/off semiconductor device of the motor contactor and/or the brake contactor. Therefore, the present invention is usable as a failure detecting apparatus for detecting a failure in a driving circuit for an electric lifting-lowering device, which can detect, in a fail-safe manner, whether each on/off mechanical contact or on/off semiconductor device of the motor contactor and/or the brake contactor is normal or abnormal (welded or fused) before or after the on/off mechanical contact or on/off semiconductor device of the motor contactor and/or the brake contactor turns on.

Further, the signal processing means processes the pulse signal from the detecting circuit connected in parallel to each on/off mechanical contact or on/off semiconductor device of the motor contactor, which is a three-phase contactor, and detects a reverse phase of the three-phase electric power to be supplied to the three-phase alternating current electric motor by the normal-abnormal detecting function. Therefore, the present invention is usable as a failure detecting apparatus for detecting a failure in a driving circuit for an electric lifting-lowering device, as follows. If the three-phase electric power to be supplied to the three-phase alternating-current electric motor is reverse-phase power before the on/off mechanical contact or on/off semiconductor device of the motor contactor turns on, the failure detecting apparatus can detect the reverse phase before the driving electric power is supplied to the three-phase alternating-current electric motor.

LIST OF REFERENCE SIGNS

1: three-phase alternating-current power supply circuit
2: motor contactor
3: three-phase alternating-current electric motor
4: brake contactor
5: brake
6a, 6b, 6c, 6d, 6e: detecting circuits
7: signal processing circuit
8: emergency stop contactor
11: resistor
12: photocoupler
13: reverse protection diode
14: resistor

The invention claimed is:

1. A failure detecting apparatus for detecting a failure in a driving circuit for an electric lifting-lowering device, the driving circuit having a three-phase alternating-current power supply circuit, the driving circuit being configured to supply three-phase alternating-current electric power from the three-phase alternating-current power supply circuit to a three-phase alternating-current electric motor through a three-phase motor contactor, the driving circuit being further configured to supply single-phase alternating-current electric power from the three-phase alternating-current power supply circuit to a brake through a single-phase brake contactor;
   the three-phase motor contactor having three-phase on/off mechanical contacts or three-phase on/off semiconductor devices for passing the three-phase alternating-current electric power;
   the single-phase brake contactor having single-phase on/off mechanical contacts or single-phase on/off semiconductor devices for passing the single-phase alternating-current electric power;
   the failure detecting apparatus comprising:
   motor detecting circuits for the motor, the motor detecting circuits being connected in parallel, respectively, to the three-phase on/off mechanical contacts or three-phase on/off semiconductor devices of the three-phase motor contactor, the motor detecting circuits being configured to output pulse signals synchronized with respective phase voltages of the three-phase alternating-current electric power from the three-phase alternating-current power supply circuit; and
   a signal processing circuit processing the pulse signals from the motor detecting circuits to perform four detecting functions including a positive-phase detecting function for detecting that a phase sequence of the three-phase alternating-current electric power to be supplied to the three-phase alternating-current electric motor is a positive phase, a reverse-phase detecting function for detecting that the phase sequence of the three-phase alternating-current electric power to be supplied to the three-phase alternating-current electric motor is a reverse phase, a welding detecting function for detecting welding of the three-phase on/off mechanical contacts or three-phase on/off semiconductor devices, and an open phase detecting function for detecting an open phase in the three-phase on/off mechanical contacts or three-phase on/off semiconductor devices,
   wherein the positive-phase detecting function and the reverse-phase detecting function are configured to detect a positive phase and a reverse phase, respectively, before the three-phase motor contactor is turned on, and the welding detecting function is configured to detect welding before the three-phase motor contactor is turned on, and the open phase detecting function is configured to detect an open phase after the three-phase motor contactor has been turned on, and
   wherein the motor detecting circuits each have an unilateral photocoupler comprising a light-emitting diode and a phototransistor, in which the light-emitting diode is caused to emit light by a phase voltage of the three-phase alternating-current electric power from the three-phase alternating-current power supply circuit that is applied to an associated three-phase on/off mechanical contact or three-phase on/off semiconductor device, and the light is converted into an electric pulse signal by the phototransistor.

2. The failure detecting apparatus of claim 1, wherein the signal processing circuit has a microcomputer and reads the pulse signals from the motor detecting circuits at a period shorter than that of the pulse signals.

3. The failure detecting apparatus of claim 2, further comprising:
- brake detecting circuits for the brake, the brake detecting circuits being connected in parallel, respectively, to the single-phase on/off mechanical contacts or single-phase on/off semiconductor devices of the single-phase brake contactor, the brake detecting circuits being configured to output pulse signals synchronized with respective phase voltages of the single-phase alternating-current electric power from the three-phase alternating-current power supply circuit;
- the signal processing circuit being configured to process the pulse signals from the brake detecting circuits to perform two detecting functions including a welding detecting function for detecting welding of the single-phase on/off mechanical contacts or single-phase on/off semiconductor devices of the single-phase brake contactor, and an open phase detecting function for detecting an open phase in the single-phase on/off mechanical contacts or single-phase on/off semiconductor devices of the single-phase brake contactor.

4. The failure detecting apparatus of claim 1, further comprising:
- brake detecting circuits for the brake, the brake detecting circuits being connected in parallel, respectively, to the single-phase on/off mechanical contacts or single-phase on/off semiconductor devices of the single-phase brake contactor, the brake detecting circuits being configured to output pulse signals synchronized with respective phase voltages of the single-phase alternating-current electric power from the three-phase alternating-current power supply circuit;
- the signal processing circuit being configured to process the pulse signals from the brake detecting circuits to perform two detecting functions including a welding detecting function for detecting welding of the single-phase on/off mechanical contacts or single-phase on/off semiconductor devices of the single-phase brake contactor, and an open phase detecting function for detecting an open phase in the single-phase on/off mechanical contacts or single-phase on/off semiconductor devices of the single-phase brake contactor.

\* \* \* \* \*